United States Patent
Bove et al.

(10) Patent No.: US 11,676,934 B2
(45) Date of Patent: Jun. 13, 2023

(54) CLIP BOND SEMICONDUCTOR PACKAGES AND ASSEMBLY TOOLS

(71) Applicant: UTAC Headquarters Pte. Ltd., Singapore (SG)

(72) Inventors: Albert Louis Bove, Singapore (SG); Hua Hong Tan, Singapore (SG); Aaron Lyn Foong Tan, Penang (MY)

(73) Assignee: UTAC Headquarters Pte. Ltd., Singapore (SG)

( * ) Notice: Subject to any disclaimer, the term of this patent is extended or adjusted under 35 U.S.C. 154(b) by 222 days.

(21) Appl. No.: 17/076,817

(22) Filed: Oct. 22, 2020

(65) Prior Publication Data

US 2021/0118840 A1 Apr. 22, 2021

Related U.S. Application Data

(60) Provisional application No. 62/924,178, filed on Oct. 22, 2019.

(51) Int. Cl.
*H01L 23/00* (2006.01)

(52) U.S. Cl.
CPC ............. *H01L 24/77* (2013.01); *H01L 24/34* (2013.01); *H01L 24/35* (2013.01); *H01L 24/40* (2013.01); *H01L 24/744* (2013.01); *H01L 24/84* (2013.01); *H01L 2224/40245* (2013.01); *H01L 2224/767* (2013.01); *H01L 2224/7765* (2013.01); *H01L 2224/77611* (2013.01); *H01L 2224/77621* (2013.01); *H01L 2224/77745* (2013.01); *H01L 2224/8412* (2013.01); *H01L 2224/95* (2013.01); *H01L 2224/95122* (2013.01)

(58) Field of Classification Search
CPC ....... H01L 24/34; H01L 24/35; H01L 24/744; H01L 24/77; H01L 24/84; H01L 2224/95; H01L 2224/9511; H01L 2224/95122; H01L 2224/77611; H01L 2224/7765; H01L 2224/767
See application file for complete search history.

(56) References Cited

U.S. PATENT DOCUMENTS

2006/0016855 A1\* 1/2006 Tanabe ............ H01L 23/49524
228/5.7

FOREIGN PATENT DOCUMENTS

KR 101949334 B1 2/2019

\* cited by examiner

*Primary Examiner* — David A Zarneke
(74) *Attorney, Agent, or Firm* — Horizon IP Pte Ltd.

(57) ABSTRACT

The present disclosure is directed to a high throughput clip bonding tool or system which is flexible and easily adapts to different clip bond pitches or sizes. The clip bonding system may be an integrated system with various modules, including a clip singulation module, a feeder module, a transfer module and a clip attach module within a shared footprint. For example, an incoming clip source may be fed to the clip singulation module for clip singulation before the singulated clips are transferred by the feeder and transfer modules to a clip presentation area for clip alignment before pickup. A pickup tool of the clip attach module is configured to facilitate pickup and attachment of clips onto the semiconductor packages to be clip bonded. For example, the pickup head is programmable to facilitate clip bonding process of different applications which may require clips and packages with different sizes.

20 Claims, 15 Drawing Sheets

US 11,676,934 B2

CLIP BOND SEMICONDUCTOR PACKAGES AND ASSEMBLY TOOLS

CROSS-REFERENCE TO RELATED APPLICATION

This application claims the benefit of U.S. Provisional Application Ser. No. 62/924,178, filed on Oct. 22, 2019, which is herein incorporated by reference in its entirety for all purposes.

FIELD OF THE INVENTION

The present invention generally relates to clip bond semiconductor packages and tools for assembling clip bond semiconductor packages. More specifically, the present invention is directed to efficient and high throughput clip bonding tool or system for high throughput assembly of clip bond semiconductor packages.

BACKGROUND

Clip bonds are widely used for packaging semiconductor devices, such as high power devices or power integrated circuits (ICs). Such power devices may include power metal oxide semiconductor field effect transistors (MOSFETs), driver MOSFETs (DrMOS), thyristors, diodes and rectifiers. Clip bonds provide a cost-efficient alternative solution to heavy wire bonds or ribbons to satisfy the performance requirements of high power devices.

The present disclosure is directed to a high throughput clip bonding tool or system for clip bond packages which is flexible and easily adapts to different clip bond pitches or sizes.

SUMMARY

In one embodiment, a clip bonding system includes a singulation module configured to singulate a clip strip with a plurality of clips, a feeder module configured to receive singulated clips from the singulation module and outputs the singulated clips in an aligned output position (aligned clips) at a feeder module output. The system further includes a transfer module configured to transfer the aligned clips from the feeder module output to a presentation area with a template for holding the clips in an aligned pickup position (aligned pickup clips), and a clip attach module which is configured to move to the presentation area to pick up the aligned pickup clips from the template and move to a placement area after picking up the clips from the presentation area, the placement area is configured to provide a strip of lead frames with dies, and then bond the clips to the dies on the lead frames.

In another embodiment, a method for forming a clip bond package includes singulating, by a singulation module, a clip strip with a plurality of clips, outputting, by a feeder module, the singulated clips received from the singulation module to a feeder module output, the singulated clips are output in an aligned output position (aligned clips) at the feeder module output. The method further includes transferring, by a transfer module, the aligned clips from the feeder module output to a presentation area with a template for holding the clips in an aligned pickup position (aligned pickup clips) and configuring a clip attach module to move to the presentation area to pick up the aligned pickup clips from the template, move to a placement area after picking up the clips from the presentation area, the placement area is configured to provide a strip of lead frames with dies, and bond the clips to the dies on the lead frames.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments relate to systems and methods for efficient and high throughput assembly of clip bonds on semiconductor packages. A clip bond semiconductor package may include a single or multiple semiconductor dies or chips. The clip bond semiconductor package may include only clip bonds or a combination of clip bonds and wire bonds. In addition, in the case of a multiple die package, the dies may be configured in a planar or stacked configuration or a combination thereof.

Figure 1A:
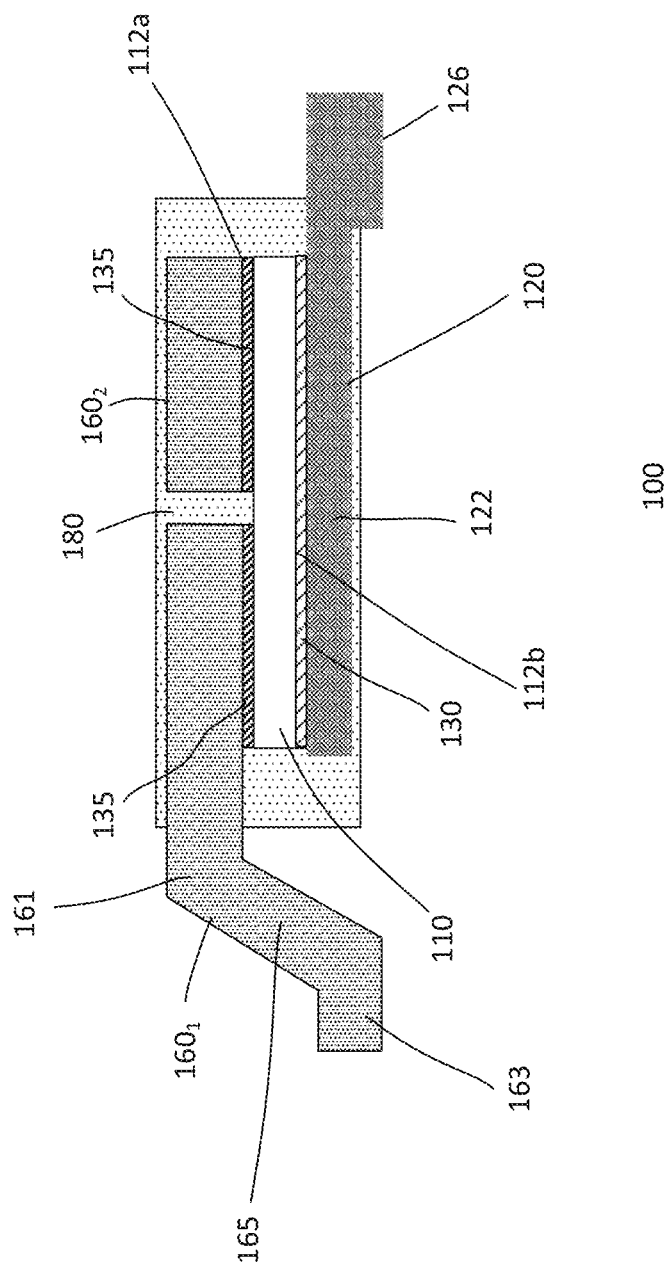
FIGS. 1a-1b show simplified cross-sectional and exploded views of an exemplary embodiment of a clip bond semiconductor package.
Figure 1B:
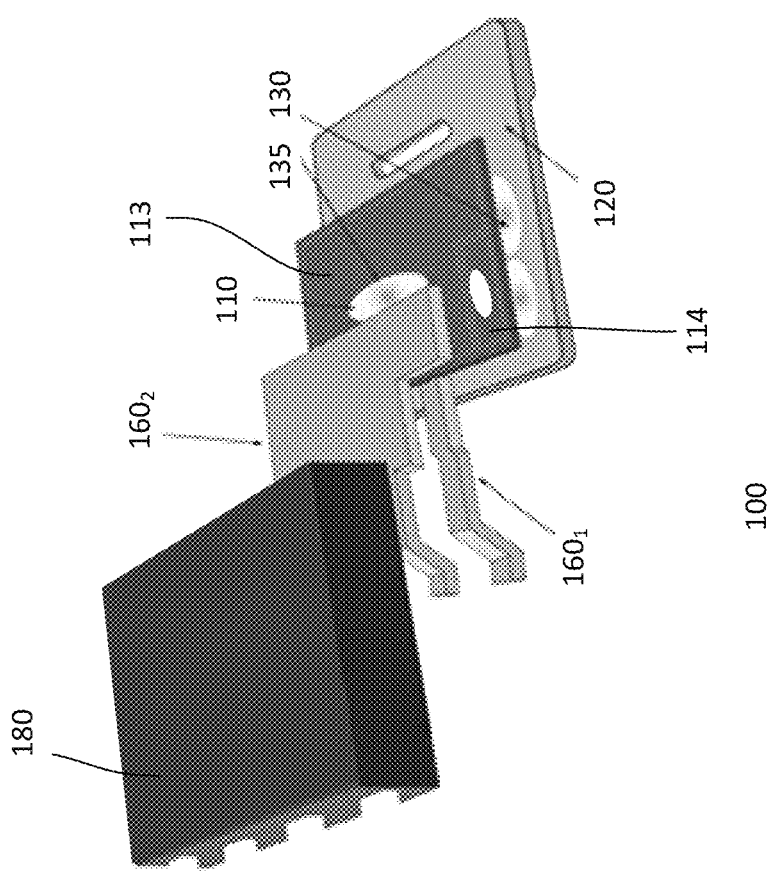

FIGS. 1a-1b show cross-sectional and exploded views of an exemplary embodiment of a clip bond semiconductor package 100. The clip bond semiconductor package, for example, is a package for a power IC. Providing a clip bond semiconductor package for other types of ICs may also be useful. As shown, the semiconductor package includes a package substrate 120. The package substrate, in one embodiment, is a lead frame, such as a copper or copper alloy lead frame. Other types of lead frames or package substrates may also be useful. The lead frame may be coated with a conductive plating, such as silver, to reduce or minimize oxidation of the clip bond. The lead frame may be a lead frame strip with a row or matrix of lead frames, enabling the processing of multiple packages in parallel and subsequently singulated into individual packages.

The lead frame includes a die attach region 122 on which a die 110 is attached. For example, a bottom surface 112b of the die is attached to the die attach region of the lead frame. Terminal pads may be provided for the lead frame. The terminal pads may surround or be located on one or more sides of the die attach region. The number and placement of terminal pads may depend on the number of die terminals or pads on the die and package configuration.

In one embodiment, the die is a power MOSFET IC. The power MOSFET IC, for example, includes a drain, source and gate connections or die terminals. For example, the die includes 3 die pads or die terminals to provide external connections to the die. In one embodiment, the drain die pad is disposed on the bottom die surface 112b of the die while the source and gate die pads 113 and 114 are disposed on die top surface 112a of the die. Other types of dies with other numbers of die pads may also be useful. In addition, the die may be configured with only die pads on the top die surface.

The bottom die surface may be attached to the die attach region with an adhesive 130. In the case where the die includes a die pad or die terminal on the bottom die surface, a reflow may be employed to bond the die to the die attach region.

As shown, the lead frame includes a terminal pad 126. The terminal pad is electrically connected to the drain die pad of the die on the bottom die surface via the die attach region.

Clip bonds 160$_{1-2}$ are provided to electrically couple to die pads on the top die surface 112a. In one embodiment, a first clip bond 160$_1$ and a second clip bond 160$_2$ are attached to the source and gate die pads 113 and 114 on the top die surface. A conductive adhesive 135, such as solder paste, is used to bond the clip bonds to the die pads.

In one embodiment, a clip bond is formed as a metallic clip, such as a copper or copper alloy clip. For example, the clip is formed of a conductive sheet, such as a copper or copper alloy sheet. Other types of metal sheets may also be used to form the clip. The conductive sheet may be plated for better compatibility with a bonding layer. The plating may also serve to reduce or minimize oxidation of the clip bond. The plating material may be silver. Other plating materials may also be useful. The conductive sheet may be singulated to form individual clips. In addition, an individual clip may be processed after bonding to form multiple clip bonds. For example, the clip may be patterned, such as an etching process, to form multiple clip bonds.

In one embodiment, the clips may be formed with the desired side and top profiles. As shown, the clip has a stepped side profile. For example, the clip includes planar upper 161 and lower portions 163 connected by a riser portion 165. The riser portion, as shown, is slanted at an angle between the upper and lower portions. Providing a vertical riser portion may also be useful. The planar upper portion includes a clip pad which is coupled to a die contact pad on the top die surface. The lower portion, for example, serves as a foot of the clip. A leg or legs extend from the clip pad. For example, part of the upper planar portion, the riser portion and foot form a leg or legs extending from the clip pad. As shown, the legs serve as leads of the package.

As for the top profile, it includes a pattern of the clip bond. For example, the top profile includes the clip pad and legs. In one embodiment, the top profile includes a pattern, when the clip is patterned, results in multiple clip bonds with legs or leads. Other shaped profiles for the side and top may also be useful. For example, the lower portion or foot may be formed by the base of the riser portion.

In one embodiment, the conductive sheet includes the desired top profile of the clip bonds or clips. A cutter, such as a punch, singulates the clips from the conductive sheet to form individual clips with the top profile. The singulation process may also create the side profile of the clips. For example, a mold is provided. When the clips are singulated, both the top and side profiles are produced. Bending the clips to form the side profile at other processing stages may also be useful.

An encapsulant 180 is disposed on the package substrate. The encapsulant covers the die and portions of the clip bonds over it. The encapsulant, in one embodiment, exposes the leads of the package substrate. For example, the leads formed from the clip bonds and the package substrate are exposed. This results in a package with leads. The encapsulant, for example, may be a mold compound. Other types of encapsulants may also be useful.

Figure 1C:
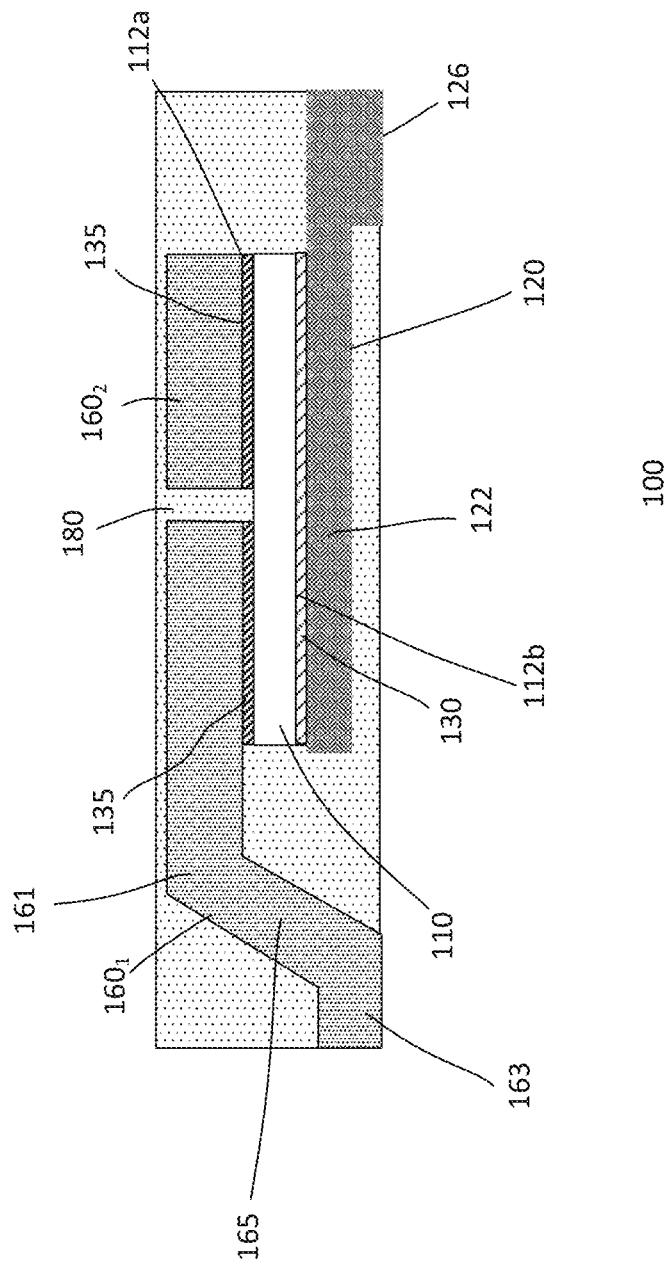
FIGS. 1c-1d show simplified cross-sectional views of other embodiments of a clip bond semiconductor package.

As described, the clip bond packages include leads. Other types of clip bond packages, such as leadless packages, may also be useful. For example, FIG. 1c shows an embodiment of a leadless clip bond package 100. The package is similar to that described in FIGS. 1a-1b. Common elements may not be described or described in detail. As shown, the mold compound 180 covers the package substrate and the clip, including the legs of the clips. This results in a leadless package. For example, the terminal pads are disposed on the backside of the package within the mold compound. For example, unlike the package of FIGS. 1a-1b, the leads do not extend beyond the mold compound.

Figure 1D:
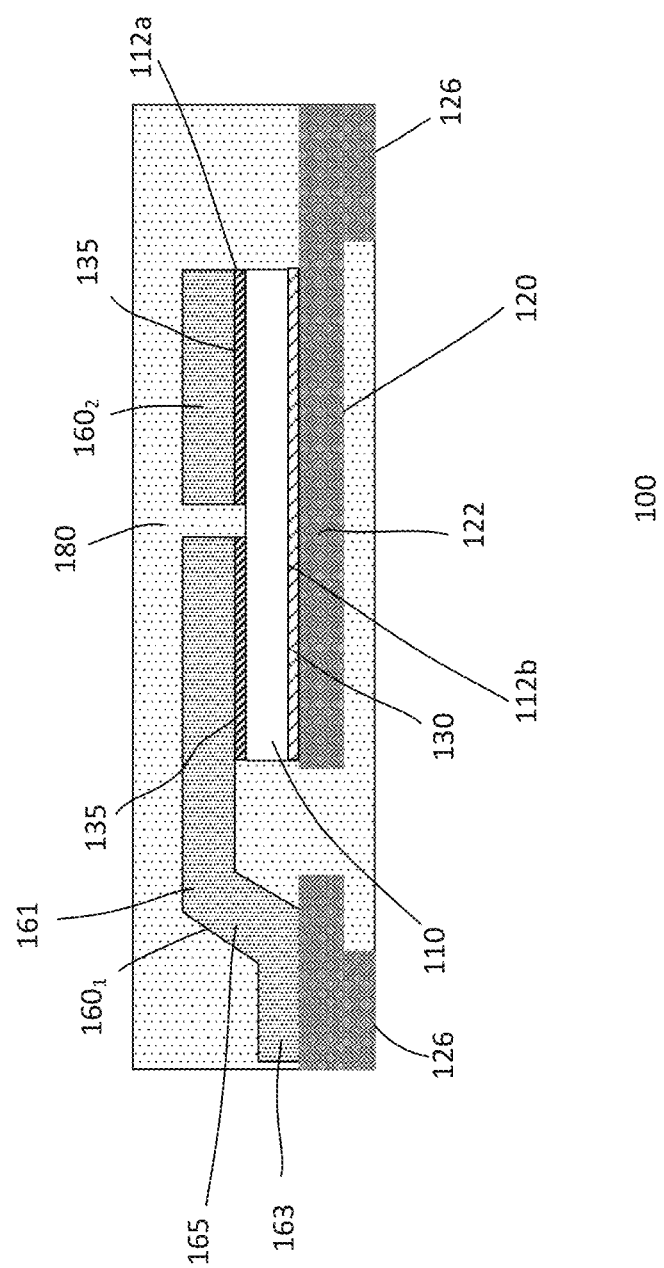

FIG. 1d shows another embodiment of a leadless clip bond package 100. The package is similar to that described in FIGS. 1a-1c. Common elements may not be described or described in detail. As shown, the package substrate 120 includes terminal pads 126 for the drain die pad and the clip bonds 160$_{1-2}$ connected to the source and gate die pads. The mold compound 180 covers the package substrate, producing a leadless package. Other configurations of packages may also be useful.

As described, clip bonds may be used in a package with or without leads. In some cases, the package may include both clip bonds and wire bonds, depending on the type of IC. In other embodiments, the package may be a multi-die package with clip bonds or a combination of clip bonds and wire bonds. The dies of the multi-die package may be stacked, in a planar configuration or a combination thereof.

Figure 2:
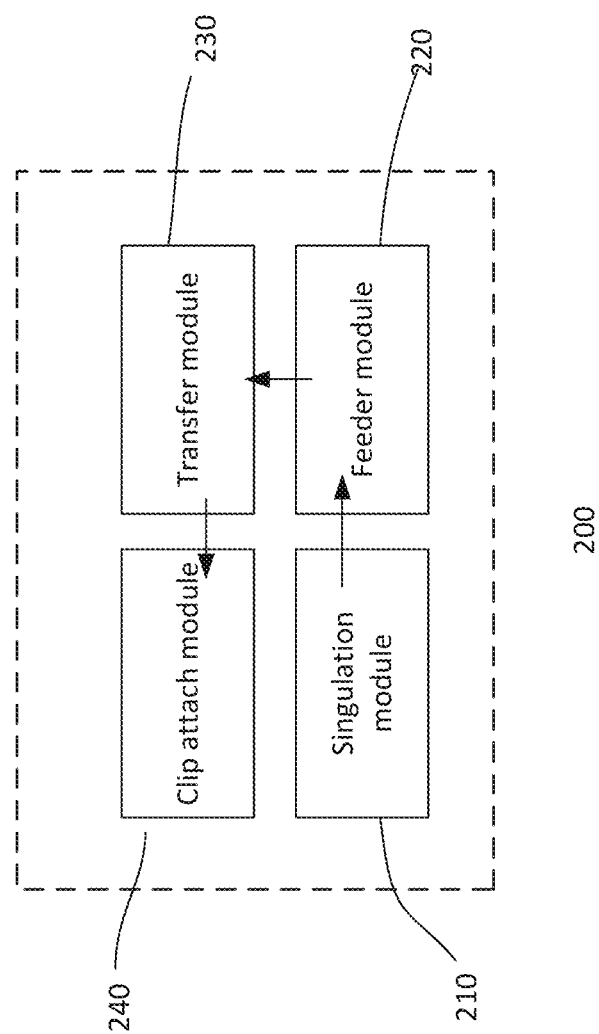
FIG. 2 illustrates a simplified block diagram of an exemplary clip bonding system or tool.

FIG. 2 illustrates a simplified block diagram of an exemplary clip bonding system 200. As shown, the clip bonding system may be an integrated system with various modules performing different operations, for example, from clip processing to clip bonding, within a shared footprint. In other embodiments, the modules may be separate units of the systems. Various configurations of the system may also be useful.

In one embodiment, the clip bonding system 200 includes a clip singulation module 210, a feeder module 220, a transfer module 230 and a clip attach module 240.

The clip singulation module includes a singulation tool for singulating clip bonds or clips from a clip strip. The clip strip, for example, may be a reel or frame defined with a plurality of clips, such as a row or a matrix of clips. The clip strip is fed into the singulation tool which singulates the clips from the clip strip. To increase clip output efficiency, multiple singulation tools may be included in the singulation module. For example, the singulation module may include two singulation tools.

The feeder module receives the singulated clips from the singulation module. The feeder module, in one embodiment, includes a bowl feeder. Singulated clips are deposited into the bowl feeder. The bowl feeder is configured to align the clips to an output position. For example, the bowl feeder vibrates to move the clips into an aligned output position. The bowl feeder may include a bowl alignment track which moves the clips into the aligned output position at the output of the bowl feeder. The aligned output position, for example, is the correct clip orientation and position for input or feed of the transfer module.

In one embodiment, the bowl feeder is configured with two outputs. For example, the bowl feeder includes two bowl alignment tracks for outputting two clips at a time. Providing the bowl feeder with additional bowl alignment tracks for output of additional clips in the aligned output position may also be useful. Providing multiple bowl alignment tracks increases output efficiency of the bowl feeder. To further increase output efficiency, additional bowl feeders may be provided. For example, the feeder module may include two bowl feeders. Providing a feeder module with more than two bowl feeders may also be useful.

As discussed, aligned clips output from the feeder module are fed to the transfer module. In one embodiment, the transfer module is configured to transfer the clips to the clip attach module. The transfer module, for example, includes a rail configured for transferring aligned clips from the output of the bowl feeder. In one embodiment, a rail includes a transfer track for transferring the aligned clips from the output of the bowl feeder. In one embodiment, the rail includes x number of transfer tracks which is equal to the x number of bowl alignment tracks of the bowl feeder. In the case that a bowl feeder includes two bowl alignment tracks (e.g., x=2), then the rail includes two transfer tracks. For example, a transfer track is configured to transfer aligned clips from its respective bowl feeder output.

The transfer module further includes a presentation area. The presentation area serves as a staging block for receiving the aligned clips from the transfer tracks of the rail. The presentation area includes a template for receiving clips from the rail. For example, the template includes a plurality of clip holders for positioning clips in an aligned position for pick up by a pickup tool. In one embodiment, the template is configured to hold a row of aligned clips in position from the transfer tracks of the rail. The staging block includes alignment detectors to ensure that clips are aligned prior to being placed onto the template. In the case that the template has more clip holders than the transfer tracks, the staging block or template can be shifted to enable the tracks to fill unfilled clip holders until all clip holders are filled. In other cases when the number of clip holders is equal to the number of transfer tracks, no shifting is needed.

The clip attach module is configured to pick up the clips from the template and attach or bond them to dies in a placement area. The presentation area is fed with a lead frame strip with a plurality of lead frames. The lead frame strip may be configured with a matrix of lead frames arranged in rows and columns. A row, for example, has the same number of lead frames as the number of clips in the template. Providing other configurations of lead frames and clips may also be useful. For example, within a matrix of lead frames, a row has a different number of lead frames from the number of clips in the template. Dies are attached to die attach regions of the lead frames. As discussed, a lead frame may be configured to accommodate a single die or multiple dies in a planar or stacked configuration for a multi-die package.

In one embodiment, the clip attach module includes a pickup tool. The pickup tool is configured to pick up the clips from the template in the transfer module and to attach the clips to the lead frames with dies in the placement area of the clip attach module. The pickup tool, in one embodiment, includes a pickup head for picking up the clips and attaching the clips to the dies. The pickup head picks up the clips and attaches the clips in parallel. For example, the presentation area is configured with the same number of dies as the number of clips in the template. For example, the template may include 8 clips and the presentation area may be configured with rows of 8 dies.

In one embodiment, the pickup head has a software programmable pitch. For example, the pickup head may have a programmable pickup pitch and a programmable attach pitch. The programmable pickup pitch enables the pickup head to pick up the clips based on a pitch of the template. For example, a pitch of a template may be based on the clip size. Different clip sizes may require different templates having different pitches to accommodate the specific clip application. The programmable pickup pitch of the pickup head enables the pickup head to pick up clips of different sizes for different applications.

In addition, a pitch of the dies in the presentable area may depend on the size of the dies. For example, different applications may have different die sizes, resulting in different pitches. Furthermore, the die pitch in the presentation area may be different from the clip pitch in the template. Separate programmable pickup pitch and attach pitch enables the pickup head to perform both pickup and attach functions.

Figure 3:
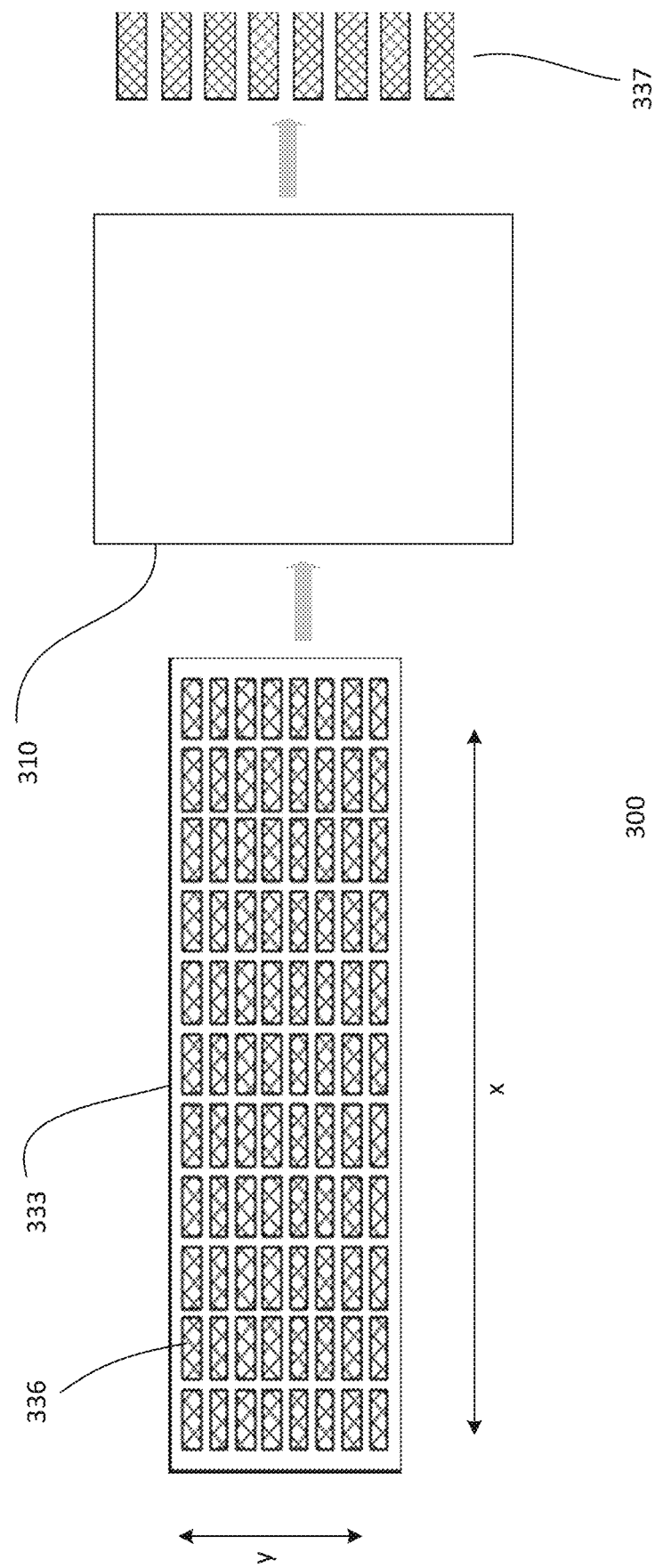
FIG. 3 shows a simplified diagram of an embodiment of a singulation module of a clip bonding system.

FIG. 3 shows a simplified diagram 300 of a singulation module 310 fed with a clip source 333. The clip source, for example, is a clip strip with clips 336 defined thereon. The clip strip may be a clip frame or a clip reel with clips defined thereon. For example, a clip frame may be a conductive sheet while a clip reel is a conductive sheet rolled in a reel. The clips may be arranged as a single column in the y direction or a single row in the x direction or rows in the x direction and columns in the y direction. As shown, the clip strip includes 8 columns of clips per row. Providing a clip strip with other numbers of columns per row may also be useful. In one embodiment, defining the clips on the clip strip may include defining an outline of the clips. For example, the clip strip may be predefined with an outline or top profile of the clips. Other techniques for defining the clip strip with clips may also be useful.

The singulation module may include a transport assembly and a singulation assembly. The transport assembly may include a track which guides the clip strip and aligns it with the singulation assembly. When the clip strip is aligned in position, the singulation assembly singulates the clips from the clip strip, generating singulated clips 337 at the output of the singulation module.

The clip singulation assembly is configured to facilitate clip singulation. For example, the clip singulation assembly includes a singulation tool and a support subassembly for supporting the singulation tool. In one embodiment, the singulation tool includes a cutting or punching member and a singulation actuator. The singulation actuator controls the punching member during clip singulation. For example, the singulation actuator moves the punching member in a z-direction (e.g., vertical direction) towards or away from the clip strip on the singulation track. For example, when a clip strip is in position for singulation, such as directly above the punching member, the singulation actuator moves the singulation tool towards the clip strip to perform clip singulation. For example, a punching head of the punching member is configured to singulate the clips from the clip strip by punching or stamping into the clip strip.

In one embodiment, the clip singulation assembly includes a cutting mold. The cutting mold, for example, may be disposed below the cutting or punching member. For example, during singulation, the mold contacts the clip strip surface while the punching head singulates from a top clip strip surface. The mold also shapes the side profile of the clip as it is singulated.

In one embodiment, the clip singulation assembly is configured to singulate clips with burr up. To form burr up clips, a bottom of the clip is punched by the punching head. Producing burr up clips is advantageous as it improves surface contact of a clip to pads on the lead frame and die as well as improves inspection. Moreover, burr up clips improves inspectability during post bond inspection. This reduces failures in packaging and increases yields.

In one embodiment, the singulation assembly is configured to singulate a row of clips. In the case where the clip strip includes 1 column of clips per row, the singulation module is configured to singulate one clip at a time. As shown, the singulation tool singulates 8 clips from the clip strip at a time. Alternative singulation configurations for the singulation assembly may also be useful. For example, the singulation assembly may be configured to singulate a specified number of clips in a column (1 column at a time), alternate rows, alternate columns or a specified matrix of dies (both in row and column direction). Singulation performed in alternate rows or columns may be useful to enable finer column and row clip pitch. For example, more clips may be fitted into the same area of the clip strip. To increase clip output efficiency, multiple singulation tools may be included in the singulation module. For example, the singulation module may include two singulation tools.

Figure 4A:
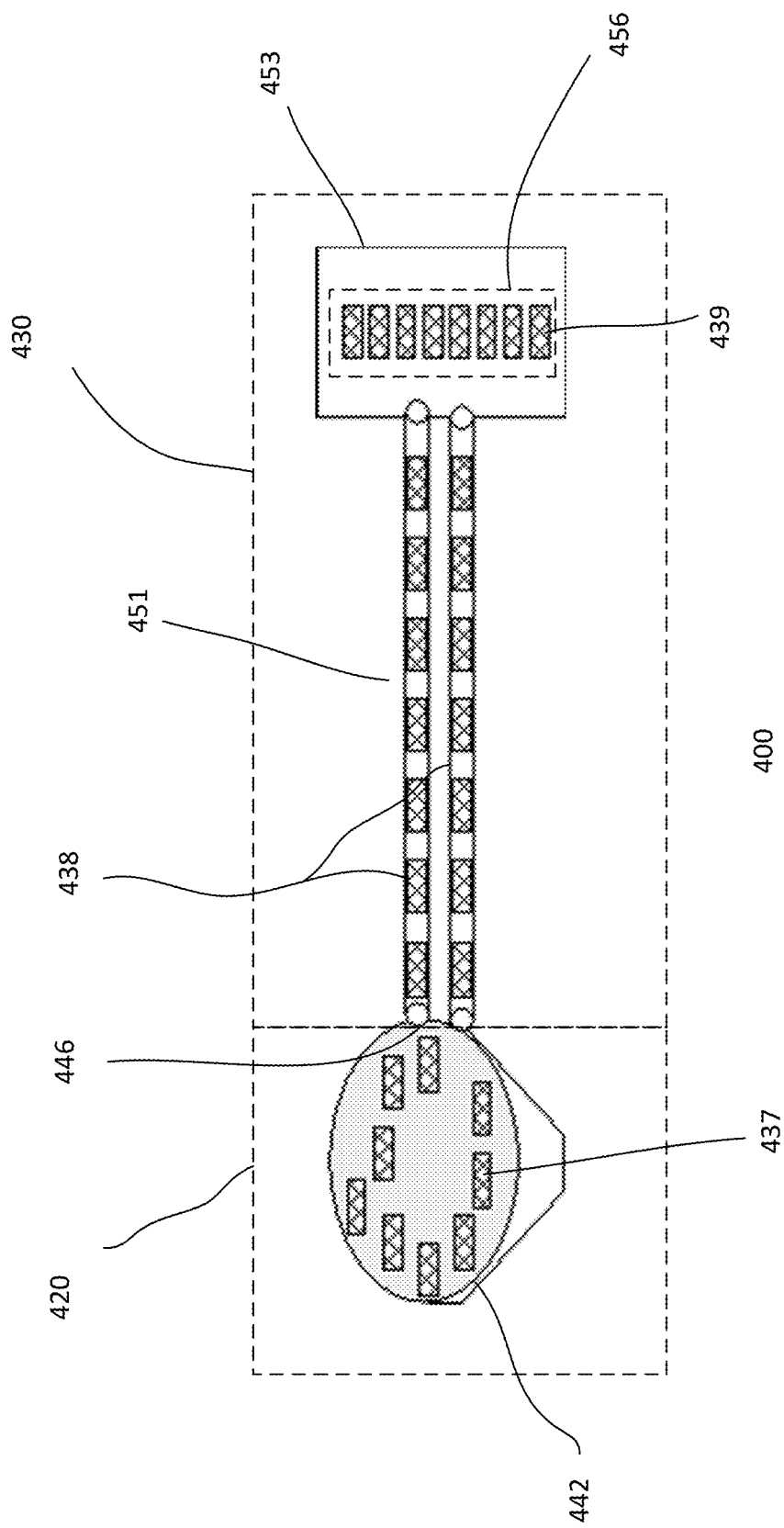
FIG. 4a shows a simplified diagram of an embodiment of a feeder module and a transfer module of a clip bonding system.

FIG. 4a shows a simplified diagram 400 of a feeder module 420 and a transfer module 430. The feeder module, as shown, includes a bowl feeder 442. The feeder module receives the singulated clips 437 from the singulation module. For example, singulated clips are deposited into the bowl feeder via a feeder input track. In one embodiment, singulated clips from the singulation module are deposited into the feeder input track which then deposits them into the bowl feeder.

In one embodiment, the bowl feeder is configured to align the clips to an output position. Vibration may be used to move the clips into the aligned output position using a bowl alignment track. For example, a vibratory feeder using vibration may be employed to feed the clips into the bowl alignment track. Other types of feeders, such as centrifugal feeders, may also be useful. The bowl alignment track moves the clips in the aligned output position at an output 446 of the bowl feeder. The bowl feeder, in one embodiment, includes two outputs. For example, the bowl feeder includes two bowl alignment tracks for outputting two aligned clips at a time. Providing the bowl feeder with additional bowl alignment tracks may also be useful.

The aligned clips output from the feeder module are fed to the transfer module 430. In one embodiment, the transfer module includes a rail 451 for transferring aligned clips from the output of the bowl feeder to a presentation area 453. In one embodiment, the rail includes two transfer tracks 438 for transferring the aligned clips from the two outputs of the bowl feeder. For example, the rail includes x number of transfer tracks which is equal to the x number of bowl alignment tracks or outputs of the bowl feeder. The transfer tracks, for example, may be a conveyor which maintains the clips in the aligned position.

The presentation area serves as a staging block for receiving the aligned clips from the transfer tracks of the rail. The presentation area, in one embodiment, includes a template 456 for receiving the clips from the rail. The template may include a plurality of clip holders for positioning the clips in an aligned position for pick up by a pickup tool. For example, the template maintains the aligned clips 439 in aligned pickup positions for pick up. In one embodiment, the template is configured to hold a row of aligned clips in position from the transfer tracks of the rail. The staging block includes alignment detectors to ensure that clips are aligned prior to being placed onto the template.

In some embodiments, multiple bowl feeders may be provided to increase transfer efficiency to the clip attach module. For example, additional bowl feeders may include corresponding transfer tracks, enabling quicker filling of the template of the presentation area.

Figure 4B:
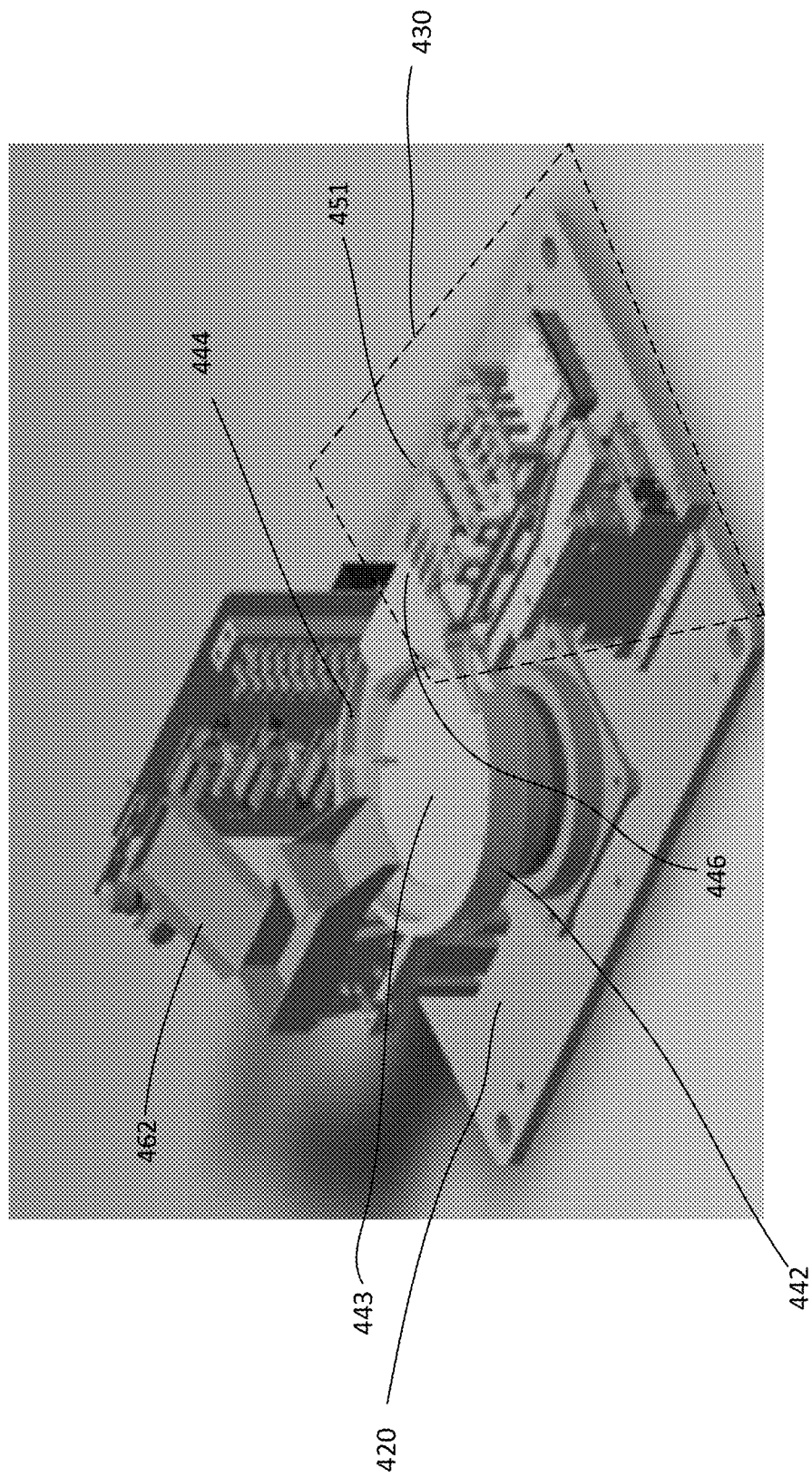
FIG. 4b shows an exemplary embodiment of a feeder module and a transfer module.

FIG. 4b shows an exemplary embodiment of a feeder module 420 and a transfer module 430. A bowl feeder 442 of the feeder module receives singulated clips from the singulation module via a feeder input track 462. The feeder input track feeds singulated clips into a center or repository 443 of the bowl feeder.

The bowl feeder includes bowl alignment tracks 444 for outputting the clips in an aligned output position at the bowl feeder output 446. Vibration may be used to move the clips into the input of the bowl alignment track which then transports the clips to the output in an aligned output position. For example, a vibratory feeder using vibration may be employed to feed the clips into the bowl alignment track. Other types of feeders, such as centrifugal feeders, may also be useful. The bowl feeder, in one embodiment, includes two outputs. For example, the bowl feeder includes two bowl alignment tracks for outputting two aligned clips at a time. Providing the bowl feeder with additional bowl alignment tracks may also be useful.

The aligned clips output from the feeder module are fed to the transfer module 430. In one embodiment, the transfer module includes a rail 451 with two transfer tracks for transferring aligned clips from the output of the bowl feeder to a presentation area 453. Alternatively, providing a rail with more than two transfer tracks may also be useful. For example, a rail may include four transfer tracks. The transfer tracks, for example, may be a conveyor which maintains the clips in the aligned position.

The presentation area (not shown) serves as a staging block for receiving the aligned clips from the transfer tracks of the rail. The presentation area, in one embodiment, includes a template for receiving the clips from the rail. The template may include a plurality of clip holders for positioning clips in an aligned position for pick up by a pickup tool. For example, the template maintains the aligned clips in aligned pickup positions for pick up. In one embodiment, the template is configured to hold a row of aligned clips in position from the transfer tracks of the rail. The staging block includes alignment detectors to ensure that clips are aligned prior to being placed onto the template.

Figure 4C:
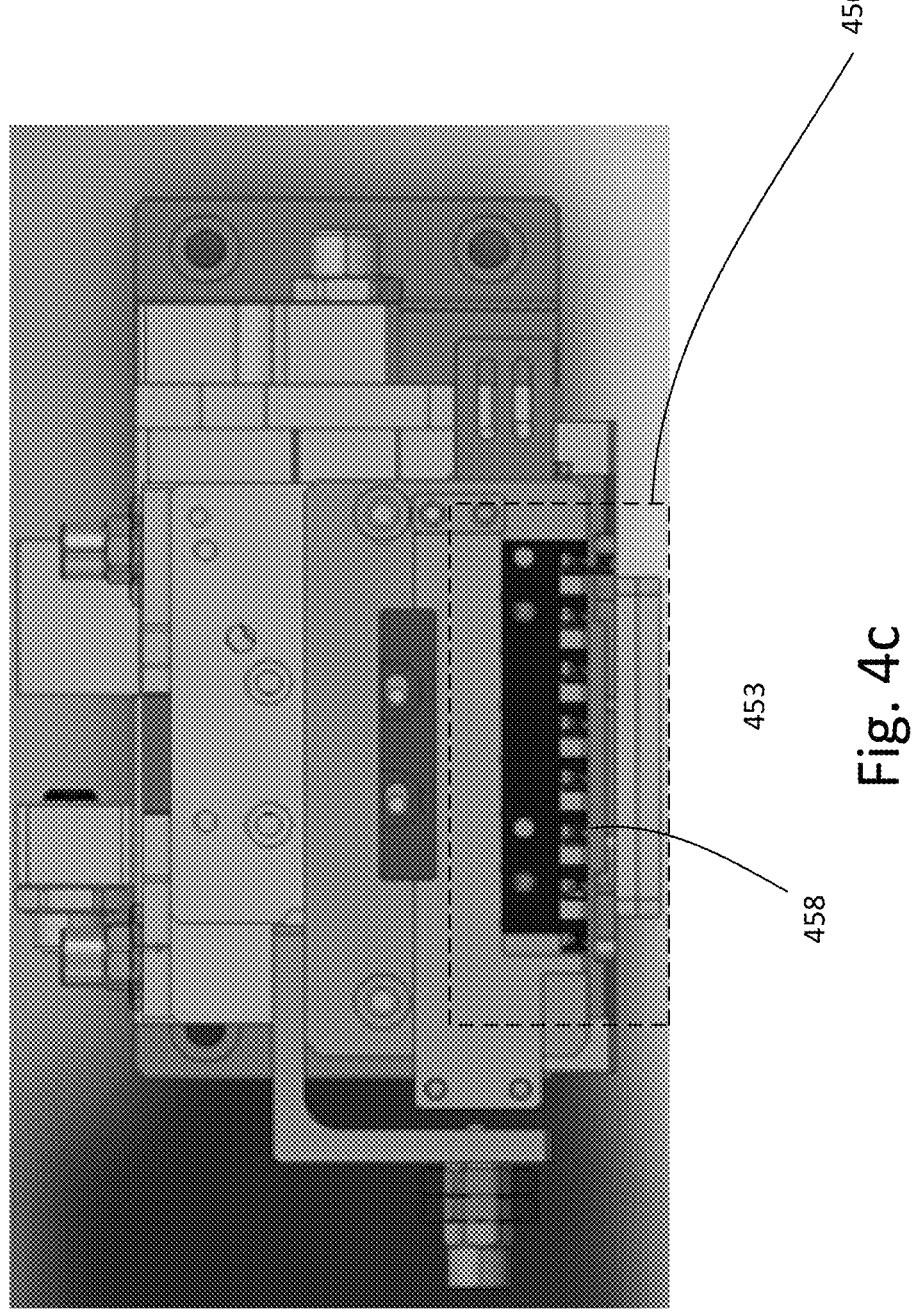
FIG. 4c shows an exemplary embodiment of a presentation area of a transfer module.

FIG. 4c shows an exemplary embodiment of a portion of a presentation area 453 of a transfer module. The presentation area includes a template 456 configured to receive clips and align them in the pickup positions. As shown, the template includes 8 slots 458 for maintaining 8 clips in the aligned pickup positions. Providing a template which maintains other numbers of clips in the aligned pickup positions may also be useful. The size of the template, for example, may depend on the number of clips a pick-up tool is configured to pick up.

Figure 5A:
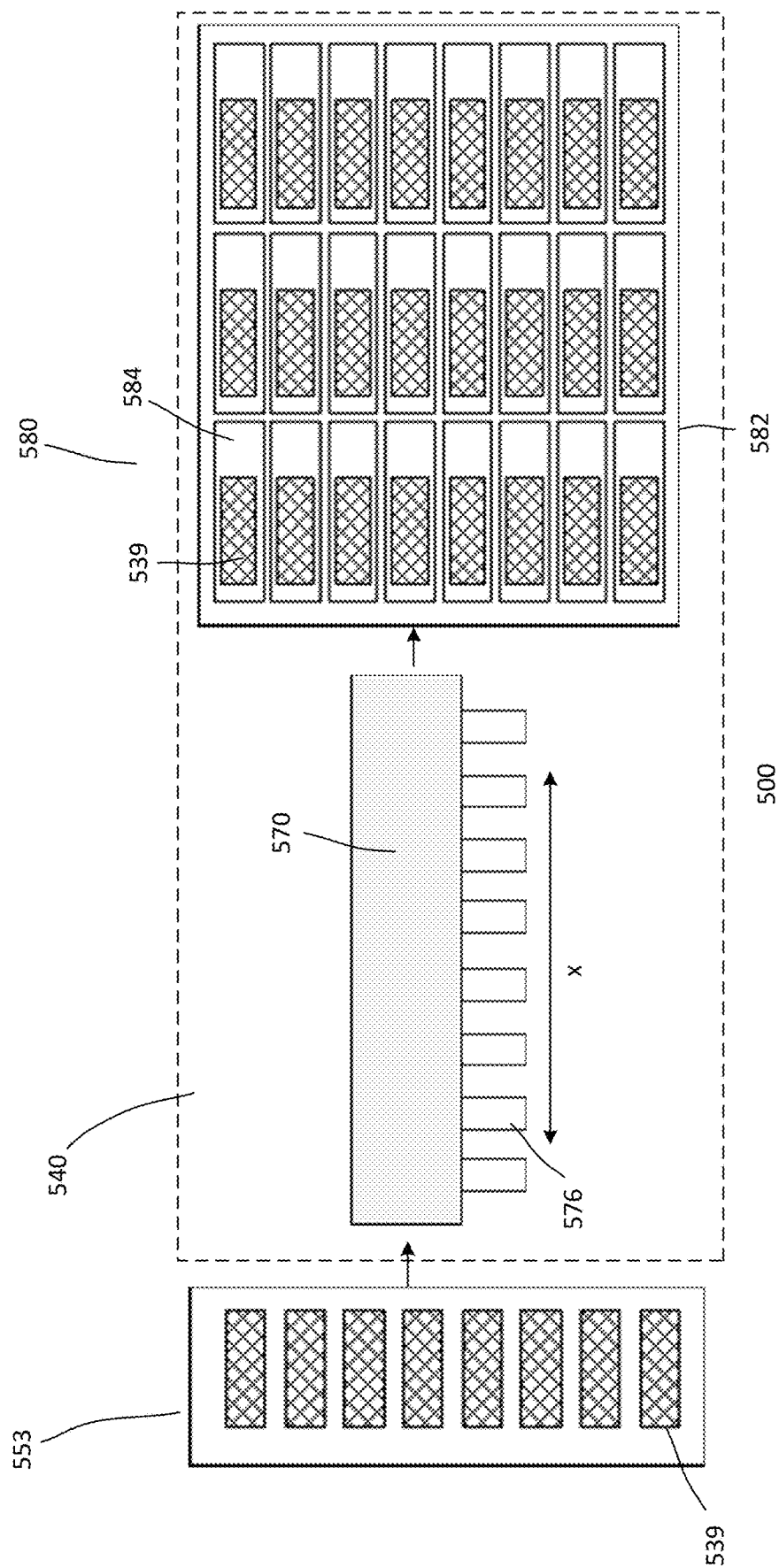
FIG. 5a illustrates a simplified embodiment of a clip attach module of a clip bonding system.

FIG. 5a illustrates a simplified diagram 500 of a clip attach module 540 picking up aligned clips 539 from a presentation area 553 of a transfer module and bonding them in a placement area 580. As shown, the presentation area presents aligned clips for the clip attach module. In one embodiment, a row of aligned clips, such as 8 clips, are provided by the presentation area for the clip attach module. Presenting other numbers of clips by the presentation area may also be useful.

The clip attach module, in one embodiment, includes a pickup tool 570. The pickup tool is configured to pick up clips from the presentation area and attach them to dies 584 on the placement area 580 of the clip attach module. In one embodiment, the placement area is fed with a lead frame strip 582 having a plurality of lead frames with dies attached. The lead frame strip, for example, includes a matrix of lead frames with dies attached thereto. For example, dies are attached to the lead frame strip in preparation for clip bonding by the pickup tool. The pads of the dies and lead frame (if applicable) include a conductive adhesive, such as solder paste, for clip bonding.

The pickup tool may be mounted on a pickup frame which is configured to enable it to move from the presentation area to pick up the clips and then to the placement area for attaching the clips 539 onto the dies and lead frames (if applicable). For example, the pickup tool may be translated in the x-y plane for positioning it to pick up and bond positions as well as in the z direction to pick up when in the x-y pick up position or in the x-y bond position. A pickup controller may control positioning the pickup tool as well as actuating the pickup head of the pickup tool for picking up and bonding clips.

In one embodiment, the pickup head of the pickup tool includes pickup fingers 576 configured for picking up clips from the template and bonding them to the dies and lead frames. For example, a pickup finger includes a suction cup configured to pick up a clip by vacuum. For example, a vacuum is applied so that a bottom or contact surface of the suction cup which is in contact with the clip can facilitate the pickup. In one embodiment, the contact surface of the suction cup is configured to have a similar or slightly larger size than the clip. This prevents undesired movement from the clip during the pickup process. Alternatively, applying other configurations for pickup may also be useful. For example, electromagnetic or mechanical forces may be applied instead. The pickup head is configured to pick up a row of clips and bond the row of clips to dies on lead frames. As shown, the pickup head is configured for picking up 8 dies from the presentation area 553 and bonding 8 clips in the placement area 580. Other configurations of the pickup head, such as picking up other numbers of clips, may also be useful.

In one embodiment, the pickup fingers of the pickup head are programmable. For example, positions of the pickup fingers can be programmable in the x direction. This enables the pickup head to be programmed with a pickup pitch and an attach or a bond pitch. Separate programmable pickup pitch and attach pitch enables the pickup head to perform both pickup and attach functions.

Figure 5B:
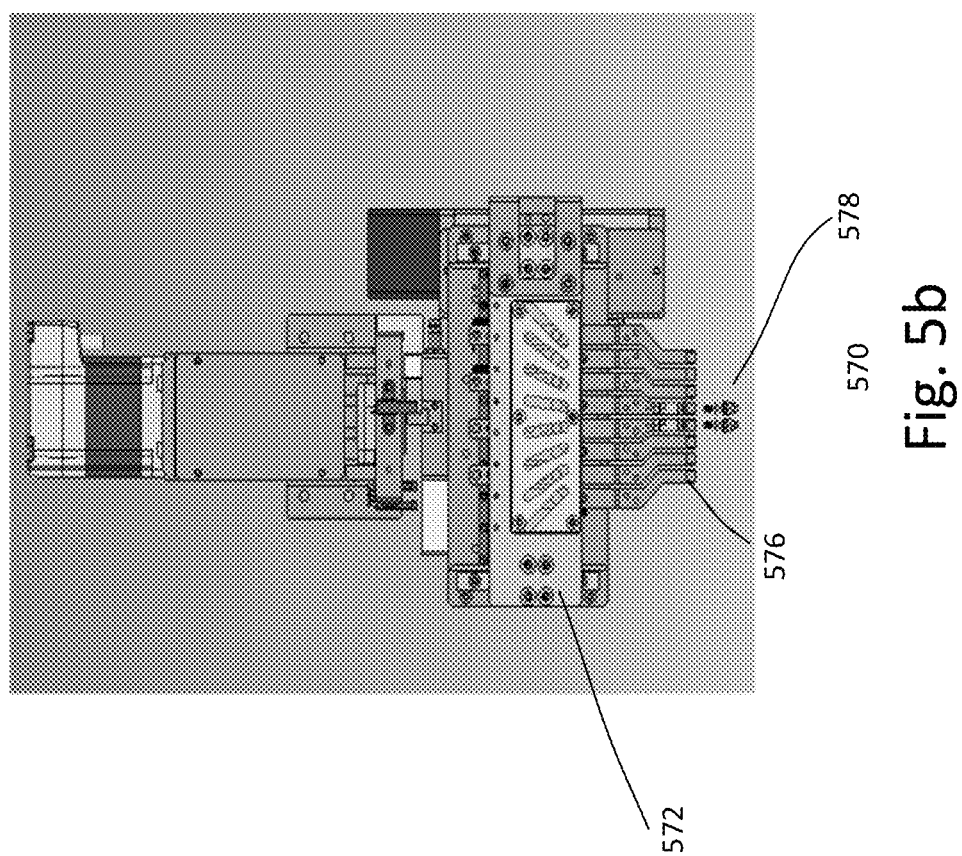
FIGS. 5b-5c show front and side views of an exemplary embodiment of a pickup tool.
Figure 5C:
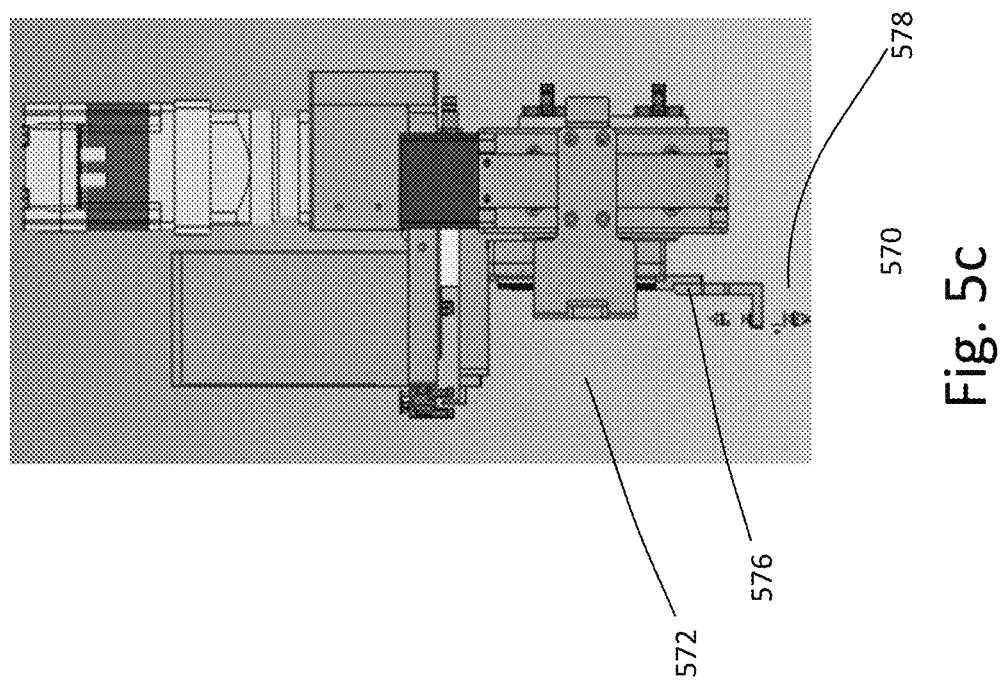

FIGS. 5b-5c show front and side views of an exemplary embodiment of a pickup tool 570. As shown, the pickup tool includes a pickup head 572. The pickup head includes pickup fingers 576 configured for picking up clips from the presentation area and bonding clips in the placement area. For example, a pickup finger includes a suction cup 578 configured to pick up a clip by vacuum. For example, a vacuum is applied so that a bottom or contact surface of the suction cup which is in contact with the clip can facilitate the pickup. In one embodiment, the contact surface of the suction cup is configured to have a similar or slightly larger size than the clip. This prevents undesired movement from the clip during the pickup process. Alternatively, applying other configurations for pickup may also be useful. For example, electromagnetic or mechanical forces may be applied instead. In one embodiment, the pickup fingers are programmable, enabling separate pickup and attach pitches. This enables the pickup head to perform both pickup and attach functions. For example, a same pickup head can be used between a template having a different clip pitch from a die pitch in the presentation area. Moreover, the same pickup head can be applied to facilitate clip bonding process of different applications which may require clips and dies with different sizes.

Figure 6A:
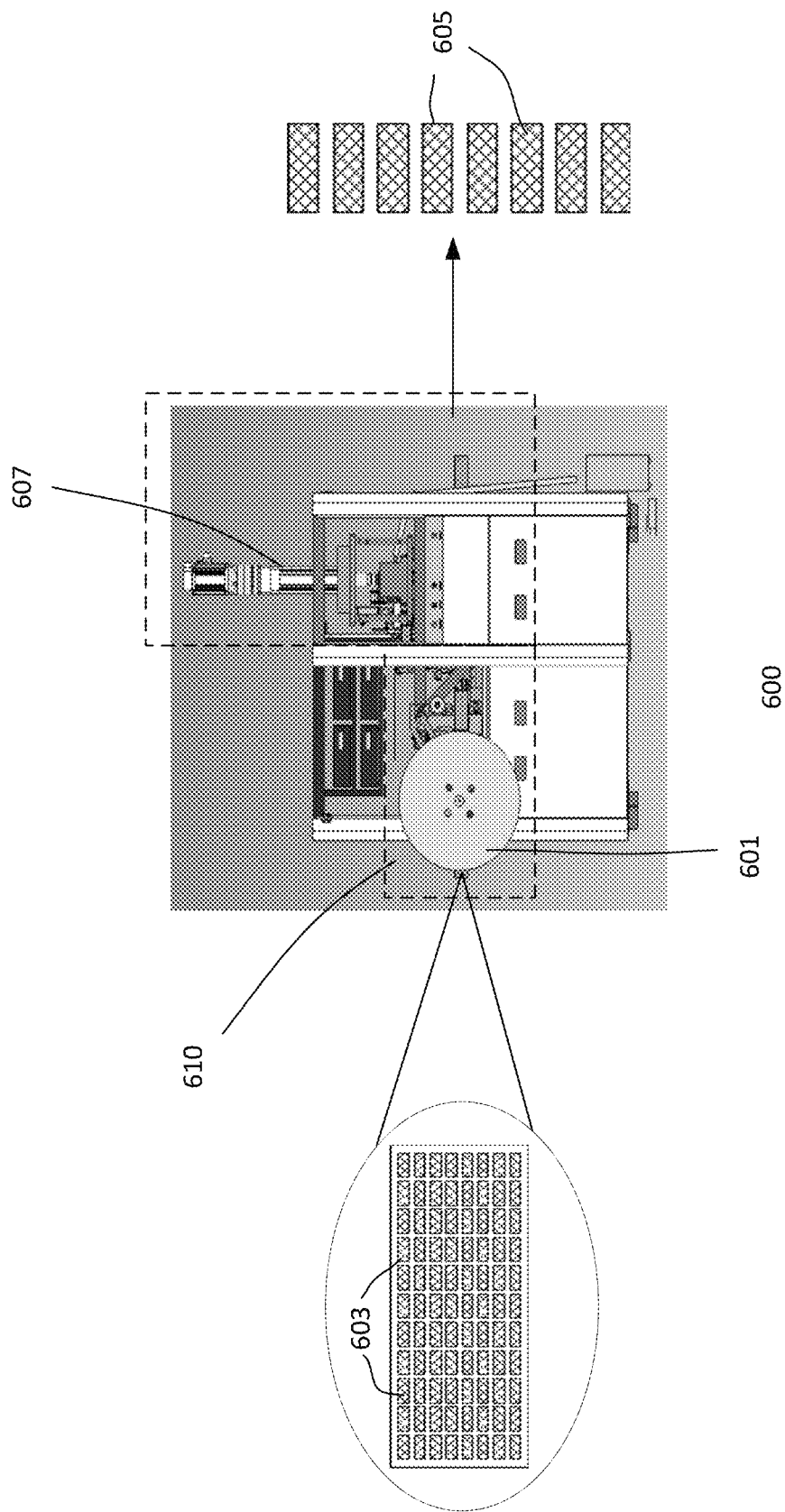
FIGS. 6a-6b show side and top views of an exemplary embodiment of a clip bonding system.
Figure 6B:
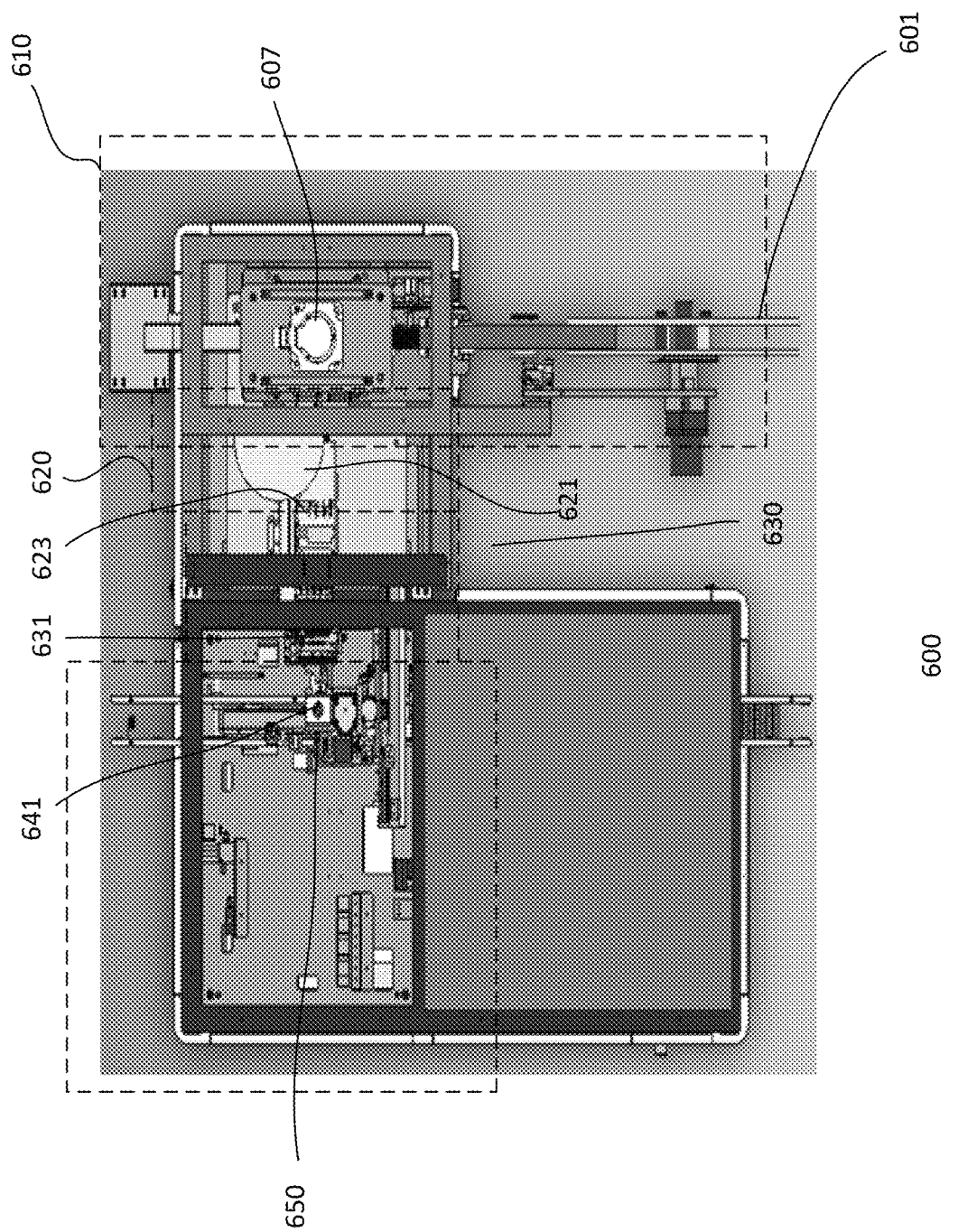

FIGS. 6a-6b show side and top views of an exemplary embodiment of a clip bonding system 600. As shown, the clip bonding system may be an integrated system with various modules, including a clip singulation module 610, a feeder module 620, a transfer module 630 and a clip attach module 640, within a shared footprint.

A clip strip may be fed into the clip singulation module which singulates the clips from the clip strip. For example, as shown, the clip strip 601 is a reel defined with a plurality of clips 603 arranged in a matrix format. Providing other configurations of the clip strip, such as a frame defined with a plurality of clips in a row or matrix format may also be possible. When the clip strip is aligned in position, a singulation tool 607 singulates the clips from the clip strip, generating singulated clips 605 at the output of the singulation module. Singulated clips are then deposited into a bowl feeder 621 of the feeder module 620. For example, singulated clips from the singulation module are deposited into a feeder input track which then deposits them into the bowl feeder.

In one embodiment, the bowl feeder 621 is configured to align the clips to an output position. For example, the bowl feeder is a vibratory feeder with bowl alignment tracks. The bowl feeder employs vibration to move the clips onto the bowl alignment tracks and align them in an aligned output position at outputs 623 of the bowl feeder. For example, each output of the bowl feeder corresponds to one bowl alignment track. In one embodiment, the bowl feeder may include two bowl alignment tracks with two outputs. Alternatively, providing other numbers of bowl alignment tracks may also be useful.

The aligned clips output from the feeder module are fed to the transfer module 630. In one embodiment, the transfer module includes a rail for transferring aligned clips from the output of the bowl feeder to a presentation area 631. For example, the rail includes transfer tracks for transferring the aligned clips from the two outputs of the bowl feeder. The number of transfer tracks corresponds to the number of bowl alignment tracks or outputs of the bowl feeder. Providing other numbers of bowl alignment tracks may also be useful. Clips on the transfer tracks are maintained in their aligned position as they are passed on to the presentation area.

The presentation area 631 serves as a staging block for receiving the aligned clips from the transfer tracks of the rail. For example, the staging block may include alignment detectors to ensure that clips are aligned prior to being placed onto the template. The presentation area, in one embodiment, includes a template for receiving the clips from the rail. The template may include a plurality of clip holders for positioning the clips in an aligned position for pick up by a pickup tool. For example, the template maintains clips in their aligned pickup positions so that they are ready for pick up by a pickup tool of the clip attach module.

The clip attach module 640, in one embodiment, includes a pickup tool 641. The pickup tool is configured to pick up clips from the presentation area and attach them to dies on the placement area 650 of the clip attach module. In one embodiment, the placement area is fed with a lead frame strip having a plurality of lead frames with dies attached. The lead frame strip, for example, includes a matrix of lead frames with dies attached thereto. For example, dies are attached to the lead frame strip in preparation for clip bonding by the pickup tool.

As for the pickup tool 641, it is configurable to move in a x-y plane and a z direction to facilitate clips pickup and attach. A pickup head of the pickup tool may include pickup fingers configured for picking up clips from the presentation area and attaching them to the dies and lead frames. In one embodiment, the pickup fingers of the pickup head are programmable with a pickup pitch and an attach pitch. Separate programmable pickup pitch and attach pitch enables the pickup head to perform both pickup and attach functions. For example, a same pickup head can be used between a template having a different clip pitch from a die pitch in the presentation area. Moreover, the same pickup head can be applied to facilitate clip bonding process of different applications which may require clips and dies with different sizes.

Figure 7:
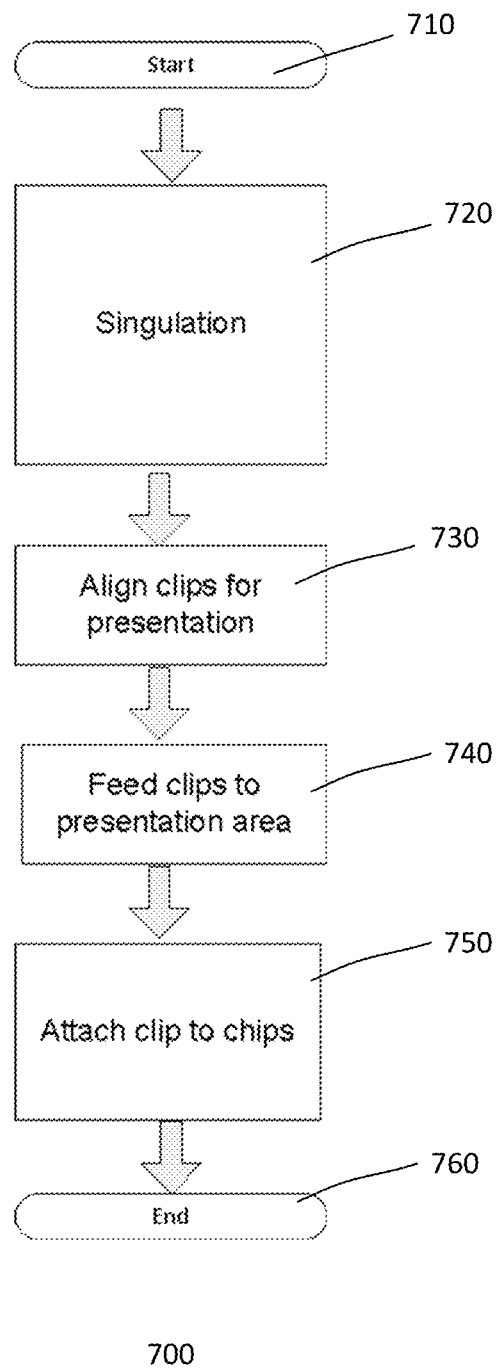
FIG. 7 shows an embodiment of a process flow for forming a clip bond package.

FIG. 7 shows a flow chart of an exemplary embodiment of a clip bond packaging process 700. The process begins at 710. For example, an incoming clip source, such as a clip strip with clips defined thereof is provided. The clip strip, for example, may be a clip reel. For example, the clip reel may include a strip of conductive sheet with a plurality of clip frames defined with arrays of clip profiles. Alternatively, clip frames may be fed separately to the clip singulation module. Providing other types or configurations of clip sources may also be useful. For example, the clip source may be a reel of a plain conductive sheet with no clip profiles.

The clip strip is fed to the singulation module at 720. The singulation tool singulates the clips on the clip strip. The singulated clips are passed to the feeder module at 730. The feeder module, for example, includes a bowl feeder which aligns the clips in an aligned output position. The aligned clips are then passed to the transfer module at 740. For example, the transfer module includes a rail for transporting the aligned clips from the output of the bowl feeder to a presentation area. The presentation area includes a template for positioning a set of aligned clips. The aligned clips are maintained in aligned pickup positions so that they are ready for pick up. A pickup tool of the clip attach module picks up the clips from the presentation area for bonding to dies on lead frames in the placement area at 750. The process may continue until all clips are bonded. When bonding is completed, the process may terminate at 760.

In one embodiment, the various processes performed by modules of the clip bonding system may be implemented as computer-readable program code tangibly embodied in one or more non-transitory computer-readable media. For example, the non-transitory computer-readable media may include instructions which, when executed by the processor, are configured to manage the various modules of the clip bonding system. For example, such instructions may include initiating a clip-bond packaging process or controlling operating parameters of the one or more modules of the clip bonding system, such as programming a pickup pitch and attach pitch of the pickup head, to achieve desired operating capacity.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A clip bonding system comprising:
a singulation module configured to singulate a clip strip with a plurality of clips;
a feeder module configured to receive singulated clips from the singulation module, the feeder module outputs the singulated clips in an aligned output position at a feeder module output;
a transfer module configured to transfer the singulated clips from the feeder module output to a presentation area with a template for holding the clips in an aligned pickup position; and
a clip attach module, the clip attach module is configured to
move to the presentation area to pick up the clips from the template,
move to a placement area after picking up the clips from the presentation area, wherein the placement area is configured to provide a strip of lead frames with dies, and
bond the clips to the dies on the lead frames.

2. The system of claim 1 wherein the singulation module includes a singulation tool configured to singulate the plurality of clips from the clip strip to produce singulated burr up clips.

3. The system of claim 1 wherein the feeder module includes a bowl feeder, wherein:
the singulated clips from the singulation module are deposited into the bowl feeder, and
an alignment track of the bowl feeder is configured to provide the clips at the feeder module output.

4. The system of claim 3 wherein the bowl feeder is a vibratory bowl feeder.

5. The system of claim 3 wherein the transfer module comprises a rail with a transfer track for moving the clips from the feeder module output to the presentation area, the transfer track is configured to load the clips onto the template in the aligned pickup position.

6. The system of claim 1 wherein the feeder module includes a bowl feeder, wherein:
the singulated clips from the singulation module are deposited into the bowl feeder, and
x alignment tracks of the bowl feeder are configured to provide x clips at the feeder module output at a time.

7. The system of claim 6 wherein the transfer module comprises a rail with x transfer tracks for moving the clips from the feeder module output to the presentation area, the transfer tracks are configured to load the clips onto the template in the aligned pickup position.

8. The system of claim 1 wherein the clip attach module includes a pickup head with pickup fingers, the pickup figures are configured to
adjust, during a pickup mode, to a pickup pitch of the pickup clips on the template, and adjust, during a clip bond mode, to a bond pitch of the lead frames with dies in the placement area.

9. The system of claim 8 wherein the clip attach module includes a pickup head with pickup fingers having a software programmable pitch, wherein the software programmable pitch includes a programmable pickup pitch and a programmable clip bond pitch.

10. The system of claim 8 wherein each pickup finger includes a suction cup with a contact surface configured to pick up a clip by vacuum.

11. A clip bonding system comprising:
a feeder module configured to receive singulated clips, the feeder module outputs the singulated clips in an aligned output position at a feeder module output;
a transfer module configured to transfer the clips from the feeder module output to a presentation area with a template for holding the clips in an aligned pickup position; and
a clip attach module, the clip attach module is configured to
move to the presentation area to pick up the clips from the template,
move to a placement area after picking up the clips from the presentation area, wherein the placement area is configured to provide a strip of lead frames with dies, and
bond the clips to the dies on the lead frames.

12. The system of claim 11 comprises a singulation module with a singulation tool for singulating a clip strip with a plurality of clips, wherein the singulation tool produces singulated burr up clips.

13. The system of claim 11 wherein the feeder module includes a bowl feeder, wherein:
the singulated clips from the singulation module are deposited into the bowl feeder, and
an alignment track of the bowl feeder is configured to provide the clips at the feeder module output.

14. The system of claim 13 wherein the bowl feeder is a vibratory bowl feeder.

15. The system of claim 11 wherein the transfer module comprises a rail with a transfer track for moving the clips from the feeder module output to the presentation area, the transfer track is configured to load the clips onto the template in the aligned pickup position.

16. The system of claim 11 wherein the clip attach module includes a pickup head with pickup fingers, the pickup figures are configured to
adjust, during a pickup mode, to a pickup pitch of the clips on the template, and
adjust, during a clip bond mode, to a bond pitch of the lead frames with dies in the placement area.

17. The system of claim 16 wherein the clip attach module includes a pickup head comprising:
pickup fingers having a software programmable pitch, wherein the software programmable pitch includes a programmable pickup pitch and a programmable clip bond pitch; and
wherein a pickup finger includes a suction cup with a contact surface configured to pick up a clip by vacuum.

18. A clip bonding system comprising:
a singulation module configured with a singulation tool for singulating a clip strip with a plurality of clips, wherein the singulation tool produces singulated burr up clips;
a feeder module configured to receive singulated clips from the singulation module, the feeder module outputs the singulated clips in an aligned output position at a feeder module output;
a transfer module configured to transfer the clips from the feeder module output to a presentation area with a template for holding the clips in an aligned pickup position; and
a clip attach module, the clip attach module is configured to
move to the presentation area to pick up the clips from the template,
move to a placement area after picking up the clips from the presentation area, wherein the placement area is configured to provide a strip of lead frames with dies, and
bond the clips to the dies on the lead frames.

19. The system of claim 18 wherein the clip attach module includes a pickup head with pickup fingers, the pickup figures are configured to
adjust, during a pickup mode, to a pickup pitch of the clips on the template, and
adjust, during a clip bond mode, to a bond pitch of the lead frames with dies in the placement area.

20. The system of claim 18 wherein the feeder module includes a bowl feeder, wherein:
the singulated clips from the singulation module are deposited into the bowl feeder, and
an alignment track of the bowl feeder is configured to provide the clips at the feeder module output.

* * * * *